(12) United States Patent
Wang

(10) Patent No.: US 12,289,882 B2
(45) Date of Patent: Apr. 29, 2025

(54) SEMICONDUCTOR DEVICE INCLUDING AIR GAP STRUCTURE ABOVE WORD LINE

(71) Applicant: CHANGXIN MEMORY TECHNOLOGIES, INC., Hefei (CN)

(72) Inventor: Luguang Wang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 551 days.

(21) Appl. No.: 17/869,206

(22) Filed: Jul. 20, 2022

(65) Prior Publication Data

US 2023/0118276 A1   Apr. 20, 2023

Related U.S. Application Data

(63) Continuation of application No. PCT/CN2021/135743, filed on Dec. 6, 2021.

(30) Foreign Application Priority Data

Oct. 15, 2021   (CN) .......................... 202111202026.0

(51) Int. Cl.
*H10B 12/00*   (2023.01)

(52) U.S. Cl.
CPC .......... *H10B 12/34* (2023.02); *H10B 12/053* (2023.02)

(58) Field of Classification Search
CPC ..... H10B 12/053; H10B 12/34; H10B 12/488
See application file for complete search history.

(56) References Cited

U.S. PATENT DOCUMENTS

| | | | |
|---|---|---|---|
| 2008/0061320 A1 | 3/2008 | Von Kluge | |
| 2008/0061322 A1* | 3/2008 | von Kluge | H10B 12/053 |
| | | | 257/E21.429 |
| 2015/0221742 A1* | 8/2015 | Yi | H10B 12/315 |
| | | | 257/295 |
| 2021/0249414 A1* | 8/2021 | Chang | H01L 23/53295 |

FOREIGN PATENT DOCUMENTS

| | | |
|---|---|---|
| CN | 111508841 A | 8/2020 |
| CN | 112885833 A | 6/2021 |

* cited by examiner

*Primary Examiner* — Nelson Garces
(74) *Attorney, Agent, or Firm* — Syncoda LLC; Feng Ma

(57) ABSTRACT

Embodiments of the disclosure disclose a semiconductor device and a method manufacturing thereof. The semiconductor device includes a substrate as well as a first groove and a second groove located in the substrate, in which the second groove is formed by etching the substrate downwards from part of a bottom surface of the first groove, and a sidewall of the second groove retracts inward by a preset length relative to a sidewall of the first groove; a word layer including a first sub-portion located in the second groove and a second sub-portion located in the first groove, in which a gap is provided between a sidewall of the second sub-portion and that of the first groove; and a word line cover layer located in the first groove and covering the second sub-portion, in which an air gap structure at least located at the gap is provided in the word line cover layer.

18 Claims, 16 Drawing Sheets

SEMICONDUCTOR DEVICE INCLUDING AIR GAP STRUCTURE ABOVE WORD LINE

CROSS-REFERENCE TO RELATED APPLICATIONS

This application is a continuation of International Patent Application No. PCT/CN2021/135743, filed on Dec. 6, 2021, which is based on and claims priority to Chinese Patent Application No. 202111202026.0, filed on Oct. 15, 2021. The disclosures of these applications are hereby incorporated by reference in their entirety.

TECHNICAL FIELD

The disclosure relates to the field of semiconductor manufacturing, and in particular to a semiconductor device and a manufacturing method thereof.

BACKGROUND

A semiconductor device, such as a memory, includes an embedded word line layer and source/drain doped regions at two sides of the word line layer. In an actual process, the word line layer and the source/drain doped regions are usually partially overlapped.

However, this overlap easily leads to a gate induced drain leakage (GIDL), which affects the reliability of the semiconductor device.

SUMMARY

The embodiments of the disclosure provide a semiconductor device including: a substrate, a first groove and a second groove located in the substrate, a word layer and a word line cover layer.

The second groove is formed by etching the substrate downwards from part of a bottom surface of the first groove. A sidewall of the second groove retracts inward by a preset length relative to a sidewall of the first groove.

A word layer includes a first sub-portion located in the second groove and a second sub-portion located in the first groove. A gap is provided between a sidewall of the second sub-portion and that of the first groove.

A word line cover layer locates in the first groove and covers the second sub-portion. An air gap structure at least located at the gap is provided in the word line cover layer.

The embodiments of the disclosure also provide a manufacturing method of a semiconductor device, which includes the following operations.

A first groove is formed in the substrate.

The substrate is etched downwards from part of a bottom surface of the first groove to form a second groove. A sidewall of the second groove retracts inward by a preset length relative to a sidewall of the first groove.

A word line layer is formed in the first groove and the second groove. The word line layer includes a first sub-portion located in the second groove and a second sub-portion located in the first groove. A gap is provided between a sidewall of the second sub-portion and that of the first groove.

A word line cover layer is formed in the first groove. An air gap structure formed at least at the gap is provided in the word line cover layer.

DETAILED DESCRIPTION

Figure 1A:
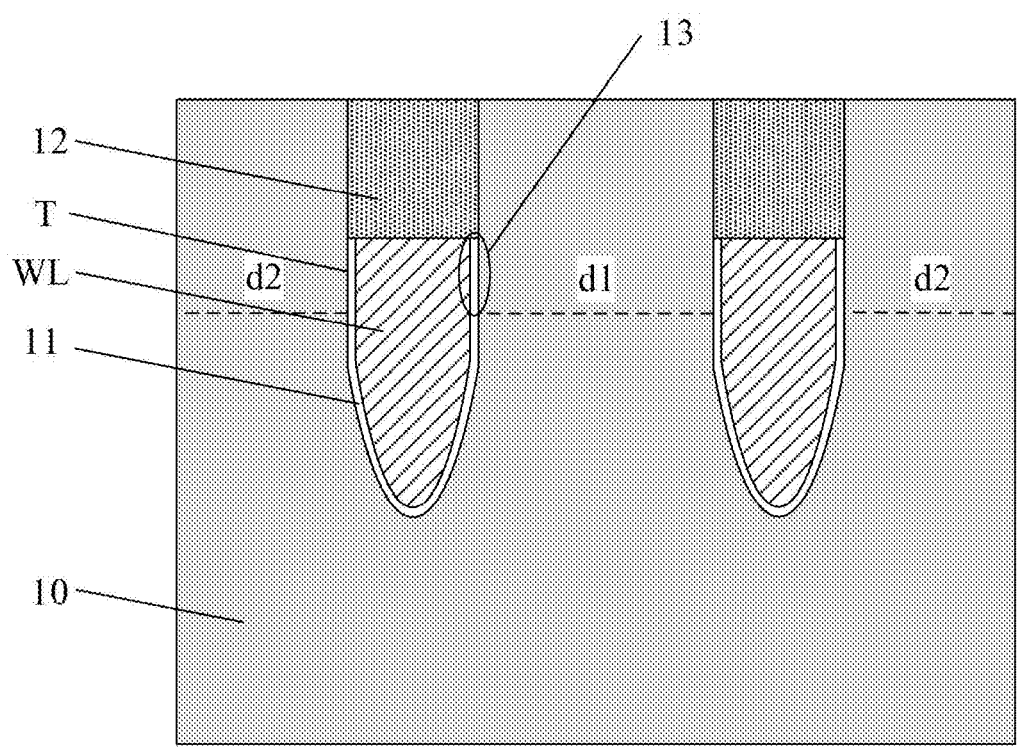
FIGS. 1A to 1B are schematic diagrams of semiconductor devices provided in the related art.

Exemplary implementation modes of the disclosure will be described in more detail below with reference to the accompanying drawings. Although the exemplary implementation modes of the disclosure are shown in the drawings, it should be understood that the disclosure may be implemented in various forms and should not be limited by specific implementation modes set forth here. On the contrary, these implementation modes are provided in order to have a more thorough understanding of the disclosure and to fully convey the scope of the disclosure to those skilled in the art.

In the following description, numerous specific details are set forth in order to provide a more thorough understanding of the disclosure. However, it will be apparent to those skilled in the art that the disclosure can be implemented without one or more of these details. In other examples, in order to avoid confusion with the disclosure, some technical features well-known in the art are not described. That is, not all features of actual embodiments are described, and well-known functions and structures are not described in detail here.

In the drawings, the dimensions of layers, areas, elements and their relative dimensions may be enlarged for clarity. The same reference numeral indicates the same element throughout.

It should be understood that when an element or layer is referred to as being "on", "adjacent to", "connected to" or "coupled to" another element or layer, it may be directly on, adjacent to, connected to or coupled to another element or layer, or an intermediate element or layer may exist. On the contrary, when an element is referred to as being "directly on", "directly adjacent to", "directly connected to" or "directly coupled to" another element or layer, there is no intermediate element or layer. It should be understood that although the terms first, second, third, etc. may be used to describe various elements, components, areas, layers and/or parts, these elements, components, areas, layers and/or parts should not be limited by these terms. These terms are only used to distinguish one element, component, area, layer or part from another element, component, area, layer or part. Therefore, without departing from the teaching of the disclosure, the first element, component, area, layer or part discussed below may be indicated as a second element, component, area, layer or part. When the second element, component, area, layer or part is discussed, it does not mean that the first element, component, area, layer or part certainty exists in the disclosure.

Spatial relation terms such as "under", "below", "lower", "beneath", "on" and "upper" may be used here for convenience of description to describe the relationship between one element or feature shown in the drawings and another element or feature. It should be understood that in addition to the orientations shown in the drawings, the spatial relationship terms are intended to include different orientations of devices in use and operation. For example, if the device in the drawings is turned over, then the element or feature described as being "beneath" or "below" or "under" another element or feature will be oriented "on" another element or feature. Therefore, the exemplary terms "below" and "under" may include two orientations: on and beneath. The device may be otherwise oriented (rotated by 90 degrees or at other orientations) and the spatial description used here is interpreted accordingly.

The terms used here are only for the purpose of describing specific embodiments and should not be taken as a limitation on the disclosure. As used herein, singular forms of "an", "a" and "said/the" are also intended to include plural forms, unless the context clearly dictates otherwise. It should also be understood that the terms "consist of" and/or "include", as used in this specification, identify the presence of stated feature, integer, step, operation, element and/or component, but do not exclude the presence or addition of one or more other features, integers, steps, operations, elements, components and/or groups. As used herein, the term "and/or" includes any and all combinations of related listed items.

A semiconductor device, such as a dynamic random access memory (DRAM), includes an embedded word line layer and source/drain doped regions at both sides of the word line layer. In actual processes, the word line layer and the source/drain doped regions often partially overlap.

FIG. 1A is a schematic diagram of a semiconductor device provided in the related art. As shown in FIG. 1A, the semiconductor device includes a substrate 10 and a groove T located in the substrate 10; a word layer WL located in the groove T; a gate dielectric layer 11 located between the word line layer WL and the substrate 10; a word line cover layer 12 located in the groove T and covering the word line layer WL and the gate dielectric layer 11; a first source/drain doped region d1 and a second source/drain doped region d2 located at two sides of the word line layer WL. An overlapping area 13 exists between the first source/drain doped region d1, the second source/drain doped region d2 and the word line layer WL. The first source/drain doped region d1 and the second source/drain doped region d2 are separated from the word line layer WL by the gate dielectric layer 11 in the overlapping area 13.

However, due to a thin thickness of the gate dielectric layer 11, the electric field intensity generated in the gate-drain overlapping area, i.e., the overlapping area 13, is large, which aggravates the GIDL effect, resulting in an increase in leakage current when the device is in the off state, and an increase in static power consumption, thereby reducing the device lifetime.

Figure 1B:
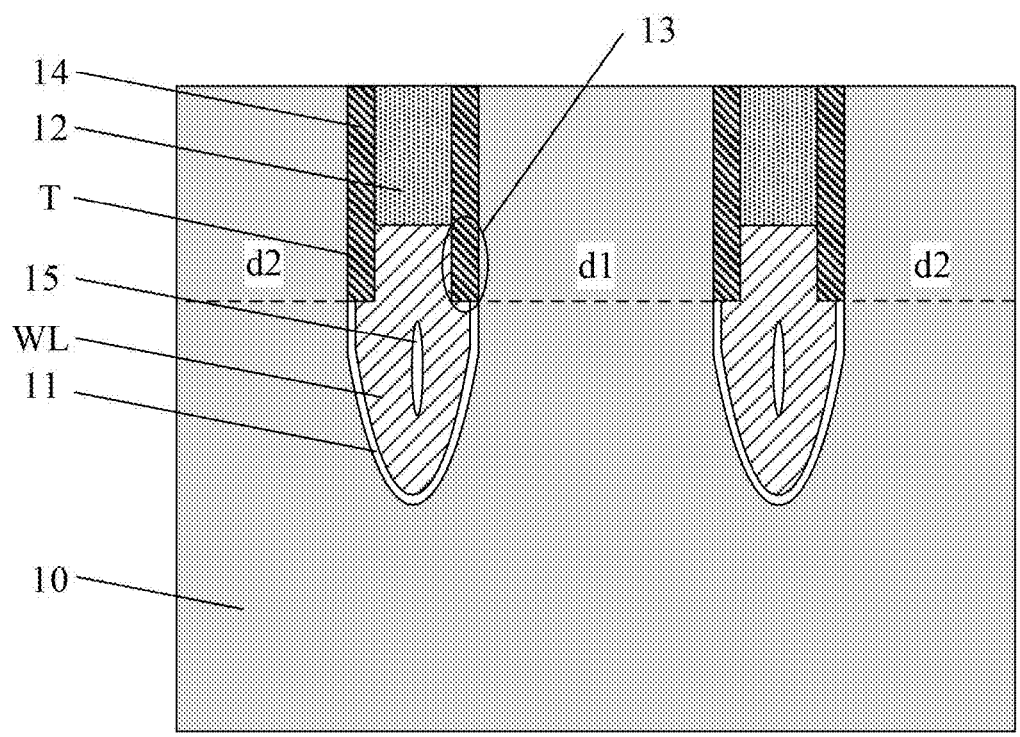

To solve the above problems, researchers try to increase the thickness of the dielectric layer in the overlapping area. FIG. 1B is a schematic diagram of another semiconductor device provided in the related art. As shown in FIG. 1B, the semiconductor device includes a substrate 10 and a groove T located in the substrate 10; a word line layer WL located in the groove T, in which a gap (not identified) exists between the upper part of the word line layer WL and the groove T; a word line cover layer 12 located in the groove T and covering the upper surface of the word line layer WL; a gate dielectric layer 11 located between the word line layer WL and the substrate 10; a dielectric layer 14 at least filling the gap, in which the thickness of the dielectric layer 14 is greater than that of the gate dielectric layer 11; a first source/drain doped region d1 and a second source/drain doped region d2 located at two sides of the word line layer WL. An overlapping area 13 exists between the first source/drain doped region d1, the second source/drain doped region d2 and the word line layer WL. The first source/drain doped region d1 and the second source/drain doped region d2 are separated from the word line layer WL by the dielectric layer 14 in the overlapping area 13, and the dielectric layer 14 has a large thickness, which can effectively alleviate the GIDL electric leakage phenomenon in the overlapping area 13.

However, in the actual process, the word line layer WL is deposited in the groove T after the dielectric layer 14 is formed. Because the dielectric layer 14 has a large thickness, the filling of the word line layer WL is affected. The air gap 15 is easily generated in the word line layer WL, which affects the performance of the semiconductor device. Based on this, the following technical solutions of the embodiments of the disclosure are proposed.

The embodiments of the disclosure provide a semiconductor device including: a substrate and a first groove and a second groove located in the substrate, a word layer, and a word line cover layer.

The second groove is formed by etching the substrate downwards from part of a bottom surface of the first groove. A sidewall of the second groove retracts inward by a preset length relative to a sidewall of the first groove.

The word layer includes a first sub-portion located in the second groove and a second sub-portion located in the first groove. A gap is provided between a sidewall of the second sub-portion and that of the first groove.

The word line cover layer locates in the first groove and covers the second sub-portion. An air gap structure at least located at the gap is provided in the word line cover layer.

In the semiconductor device provided by the embodiments of the disclosure, an air gap structure is provided between the second sub-portion of the word line layer and the substrate, which reduces the dielectric constant of the word line cover layer in contact with the word line layer, and then reduces the electric field intensity generated at the overlapping area 13 as shown in FIGS. 1A and 1B, which effectively enhances the control of the word line layer on a channel, improving the ability of a transistor to drive a current. Thus, the GIDL effect is effectively reduced, thereby improving the reliability of the semiconductor device.

In the semiconductor device provided by the embodiments of the disclosure, the sidewall of the second groove retracts inward by a preset length relative to the sidewall of the first groove, so that the voidage of the formed word line layer is low, and thus the performance of the semiconductor device is improved. Moreover, a secondary etching process is avoided when forming the word line layer, thus saving process steps.

The semiconductor device provided by the embodiments of the disclosure may be a dynamic random access memory (DRAM), but is not limited to this. The semiconductor device may also be any semiconductor device with an embedded word line layer.

In order to make the above objects, features and advantages of the disclosure more apparent and understandable, the specific implementation modes of the disclosure will be described in detail below with reference to the accompanying drawings. When describing the embodiments of the disclosure in detail, for convenience of description, the schematic diagram will not be partially enlarged according to a general scale, and the schematic diagram is only an example, which shall not limit the scope of protection of the disclosure here.

Figure 2:
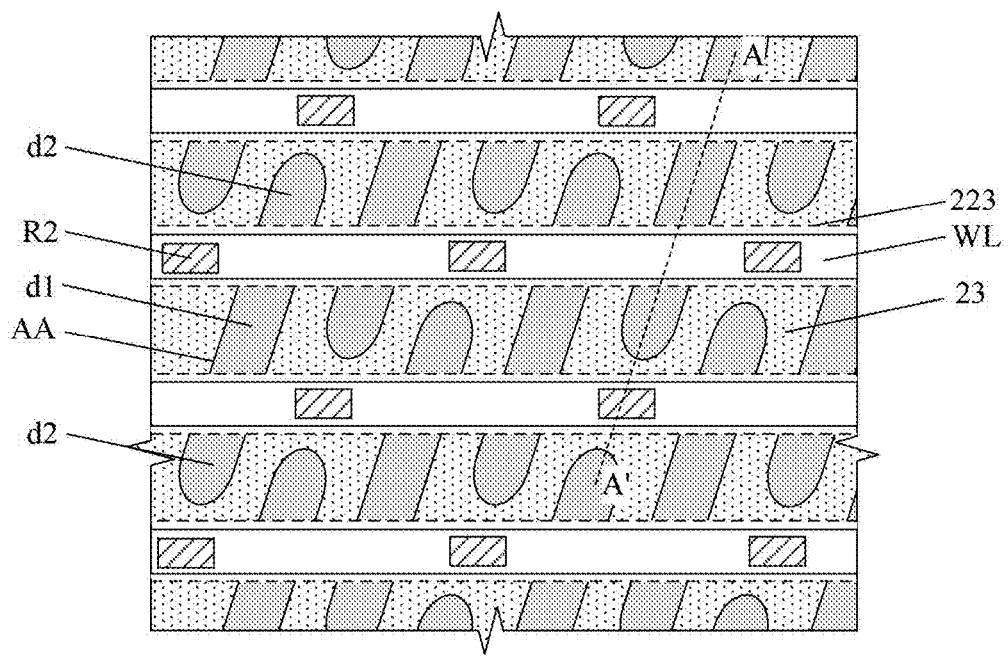
FIG. 2 is a schematic top view of a semiconductor device provided by an embodiment of the disclosure.
Figure 3:
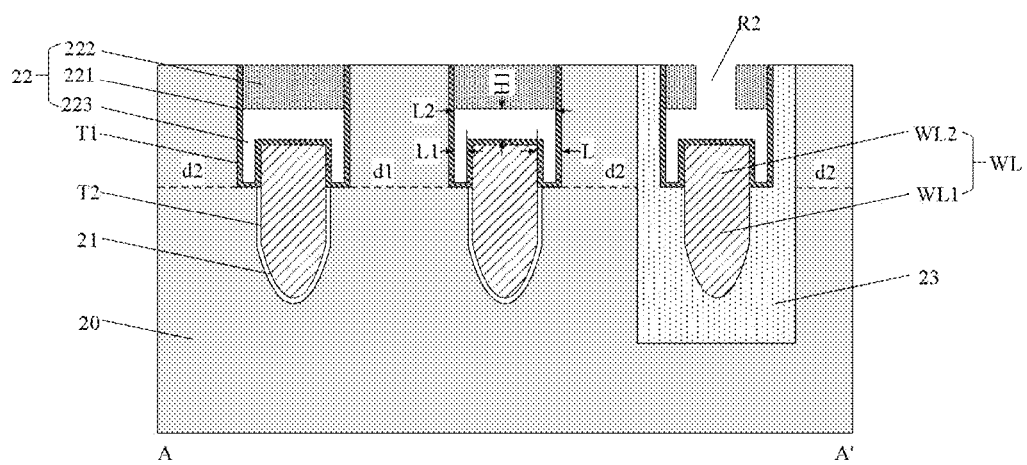
FIG. 3 is a schematic sectional structure diagram, taken along the line A-A' of FIG. 2, of a semiconductor device provided by an embodiment of the disclosure.

FIG. 2 is a schematic top view of a semiconductor device provided by an embodiment of the disclosure. FIG. 3 is a schematic sectional structure diagram of FIG. 2 taken along the dotted line A-A'. As shown in FIGS. 2 and 3, the semiconductor device includes: a substrate 20 and a first groove T1 and a second groove T2 located in the substrate 20, a word layer WL and a word line cover layer 22.

The second groove T2 is formed by etching the substrate 20 downwards from part of the bottom surface of the first groove T1. A sidewall of the second groove T2 retracts inward by a preset length L relative to a sidewall of the first groove T1.

The word layer WL includes the first sub-portion WL1 located in the second groove T2 and the second sub-portion WL2 located in the first groove T1. A gap (not identified) is provided between the sidewall of the second sub-portion WL2 and that of the first groove T1.

The word line cover layer 22 locates in the first groove T1 and covers the second sub-portion WL2. An air gap structure 223 at least located at the gap (not identified) is provided in the word line cover layer.

The substrate may be a semiconductor substrate, and may include at least one elemental semiconductor material (for example, a silicon (Si) substrate, a germanium (Ge) substrate), at least one III-V compound semiconductor material, at least one II-VI compound semiconductor material, at least one organic semiconductor material or other semiconductor materials known in the art. In a specific embodiment, the substrate is a silicon substrate, which may be doped or undoped.

In an embodiment, on the surface of the substrate is included a passivation layer (not shown) for protecting the substrate from being oxidized, nitrided, damaged or polluted or the like. The material of the passivation layer may be a nitride, for example, silicon nitride.

In an embodiment, the substrate 20 includes an isolation area 23 and an active area AA defined by the isolation area 23.

Specifically, as shown in FIG. 2, the substrate 20 includes a plurality of active areas AA arranged in parallel, and isolation areas 23 are disposed between the plurality of active areas AA. The material of the isolation areas 23 may include one or more of an oxide (for example, silicon oxide), a nitride (for example, silicon nitride) and an oxynitride (for example, silicon nitrogen oxide).

In an embodiment, the semiconductor device further includes a first source/drain doped region d1 located at two ends of an active area AA and a second source/drain doped region d2 located at the middle of the active area AA. The first source/drain doped region d1 and the second source/drain doped region d2 are separated by the word line layer WL and the word line cover layer 22 located on the word line layer WL.

In an embodiment, the first source/drain doped region d1 and the second source/drain doped region d2 are formed at the top of the active area AA by means of an ion implantation process. In a specific embodiment, the conductivity types of the first source/drain doped region d1 and the second source/drain doped region d2 are the same, e.g. n type. Understandably, when the first source/drain doped region d1 and the second source/drain doped region d2 are n-type doping, the substrate 20 under the first source/drain doped region d1 and the second source/drain doped region d2 is P-type doping.

In an embodiment, the lower surfaces of the first source/drain doped region d1 and the second source/drain doped region d2 are flush with or higher than the bottom surface of the first groove T1. That is, the lower surfaces of the first source/drain doped region d1 and the second source/drain doped region d2 are flush with or higher than the lower surface of the second sub-portion WL2. In this way, the first source/drain doped region d1 and the second source/drain doped region d2 are separated from the word line layer WL by the word line cover layer 22 with the air gap structure 223 located at least at the gap (not identified).

The sidewall of the second groove T2 retracts inward by the preset length L relative to the sidewall of the first groove T1. In an embodiment, a ratio of the preset length L to the width of the word line layer WL is between 1:7 and 1:4, for example, between 1:8 and 1:5.

In an embodiment, there are a plurality of word line layers WL. The plurality of word line layers WL extend in a same direction through the active areas AA and the isolation areas 23, and have a uniform height in the extension direction. The material of the word line layers WL includes tungsten (W), copper (Cu), titanium (Ti), tantalum (Ta), titanium nitride (TiN), tantalum nitride (TaN), a metal silicide, a metal alloy or any combination thereof. In a specific embodiment, the second sub-portions WL2 have a uniform height and width in the extension direction, and the width of the top of the first sub-portion WL1 is equal to the width of the second sub-portion WL2.

In an embodiment, the word line cover layer 22 includes a first sub-layer 221, a second sub-layer 222 located on the first sub-layer 221, and the air gap structure 223 confined by the first sub-layer 221 and the second sub-layer 222. The first sub-layer 221 covers the sidewalls and bottom surface of the first groove T1 as well as the sidewalls and upper surface of the second sub-portion WL2.

The material of the first sub-layer 221 may be a dielectric material, and specifically may be a nitride e.g. silicon nitride. In some embodiments, the second sub-layer 222 and the first sub-layer 221 are formed from a same material.

In an embodiment, the air gap structure 223 in the word line cover layer 22 extends from the gap (not identified) above the second sub-portion WL2, so that the sidewalls and the upper surface of the second sub-portion WL2 are all surrounded by the air gap structure 223. The air gap structure 223 extends above the second sub-portion WL2, which can further reduce the dielectric constant of the word line cover layer 22, thereby reducing the electric field intensity between the second sub-portion WL2 and the substrate 20. Thus, the control of the word line layer WL on the channel is effectively enhanced, improving the ability of the transistor to drive a current, thereby effectively reducing the GIDL effect and thus improving the reliability of the semiconductor device.

In an embodiment, the air gap structure 223 located at the gap (not identified) has a uniform first width L1 in the extension direction of the word line layer WL. The ratio of the first width L1 to the width of the word line layer WL is between 1:10 and 1:5.

In an embodiment, the air gap structure 223 located above the second sub-portion WL2 has a uniform second width L2 in the extension direction of the word line layer WL. The ratio of the second width L2 to the width of the word line layer WL is between 5:4 and 3:2.

In an embodiment, the air gap structure 223 located above the second sub-portion WL2 has a uniform first height H1 in the extension direction of the word line layer WL. The ratio of the first height H1 to the height of the word line layer WL is between 1:20 and 1:10.

In an embodiment, the semiconductor device further includes a dielectric layer 21 located in the second groove T2 and covering the sidewalls and a bottom surface of the second groove T2 for separating the substrate 20 from the word line layer WL. In a specific embodiment, the thickness of the dielectric layer 21 is smaller than the preset length L. The material of the dielectric layer 21 includes, but is not limited to, an oxide, for example, silicon oxide.

In a more specific embodiment, the dielectric layer 21 is formed by converting part of the active area AA into the oxide with in-situ thermal oxidation process.

It can be seen that the air gap structure 223 reduces the dielectric constant of the word line cover layer 22, thereby reducing the electric field intensity generated between the second sub-portion WL2 of the word line layer WL and the first source/drain doped region d1 as well as the second source/drain doped region d2. As a result, the control of the word line layer WL on the channel is effectively enhanced, improving the ability of the transistor to drive the current, thereby effectively reducing the GIDL effect and thus improving the reliability of the semiconductor device.

Figure 4:
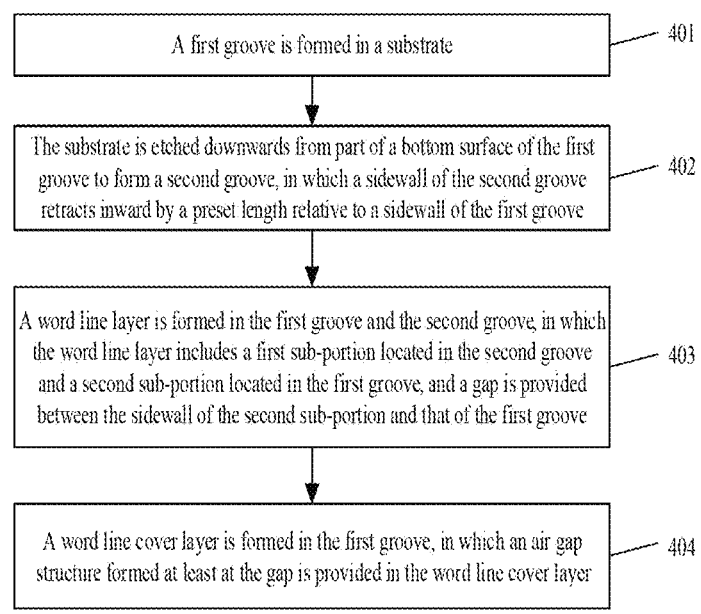
FIG. 4 is a flowchart of a manufacturing method of a semiconductor device provided by an embodiment of the disclosure.

The embodiments of the disclosure also provide a manufacturing method of a semiconductor device, as shown in FIG. 4, which includes S401, S402, S403 and S404.

At S401, a first groove is formed in a substrate.

At S402, a second groove is formed by etching the substrate downwards from part of a bottom surface of the first groove. A sidewall of the second groove retracts inward by a preset length relative to a sidewall of the first groove.

At S403, a word line layer is formed in the first groove and the second groove. The word line layer includes a first sub-portion located in the second groove and a second sub-portion located in the first groove. A gap is provided between the sidewall of the second sub-portion and that of the first groove.

At S404, a word line cover layer is formed in the first groove. An air gap structure formed at least at the gap is provided in the word line cover layer.

Next, the manufacturing method of a semiconductor device provided by the embodiments of the disclosure will be further illustrated in detail with reference to FIGS. 5A-5K.

Figure 5A:
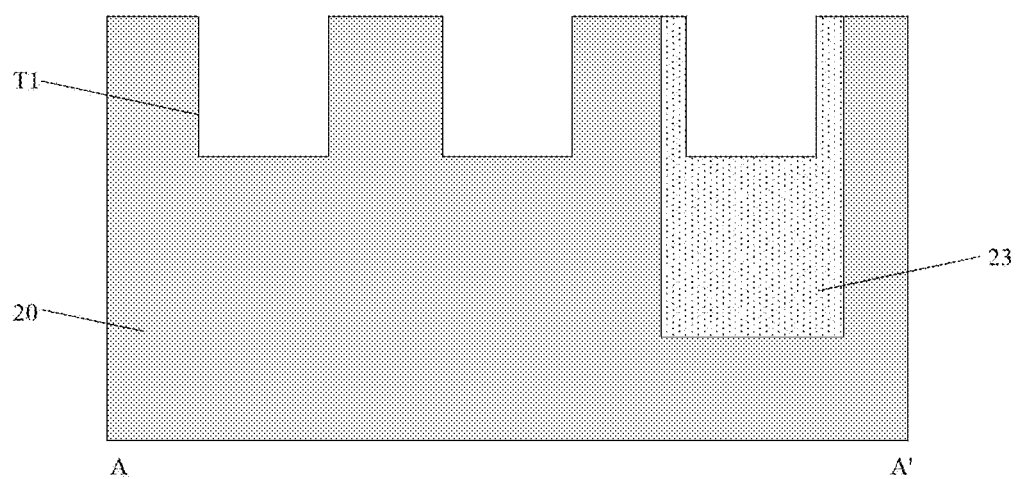
FIGS. 5A to 5K are schematic sectional structure diagrams, taken along the line A-A' of FIG. 2, of steps in a manufacturing method of a semiconductor device provided by an embodiment of the disclosure.

First, S401 is performed to form the first groove T1 in the substrate 20, as shown in FIG. 5A.

The substrate may be a semiconductor substrate, and may include at least one elemental semiconductor material (for example, a silicon (Si) substrate, a germanium (Ge) substrate), at least one III-V compound semiconductor material, at least one II-VI compound semiconductor material, at least one organic semiconductor material or other semiconductor materials known in the art. In a specific embodiment, the substrate is a silicon substrate, which may be doped or undoped.

In an embodiment, the substrate 20 includes an isolation area 23 and an active area AA defined by the isolation area 23.

Specifically, as shown in FIG. 2, the substrate 20 includes a plurality of active areas AA arranged in parallel, and isolation areas 23 are disposed between the plurality of active areas AA. The material of the isolation areas 23 may include one or more of an oxide (for example, silicon oxide), a nitride (for example, silicon nitride) and an oxynitride (for example, silicon nitrogen oxide).

Specifically, the forming the first groove T1 in the substrate 20 includes forming a patterned mask (not shown) on the substrate 20, and performing an etching process on the isolation areas 23 and the active areas AA with the patterned mask (not shown) as an etching mask to form the first groove T1. In some embodiments, the etching process includes, but is not limited to, a dry etching process, e.g. a plasma etching process.

In an embodiment, there are a plurality of first grooves T1. The plurality of first grooves T1 extend in a same direction in the substrate 20, and the first grooves T1 have a uniform height and width in the extension direction.

The plurality of first grooves T1 intersect with the active area AA, and cut the top of the active area AA into a plurality of parts. In a specific embodiment, a pair of first grooves T1 cut the top of the active area AA into three parts, and the two ends and the middle area of the top of the active area AA are separated by the first grooves T1. Please refer to FIG. 2 for details.

Next, S402 is performed to etch the substrate 20 downwards from the part of the bottom surface of the first groove T1 to form the second groove T2. The sidewall of the second groove T2 retracts inward by the preset length L relative to the sidewall of the first groove T1, as shown in FIGS. 5B-5C.

Specifically, etching the substrate 20 downwards from part of the bottom surface of the first groove T1 to form the second groove T2 includes the following operations.

Figure 5B:
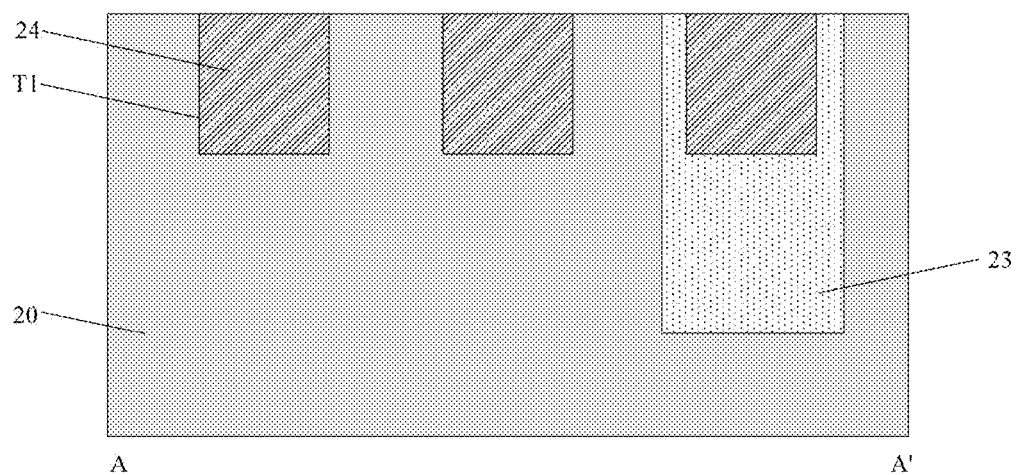
Figure 5C:
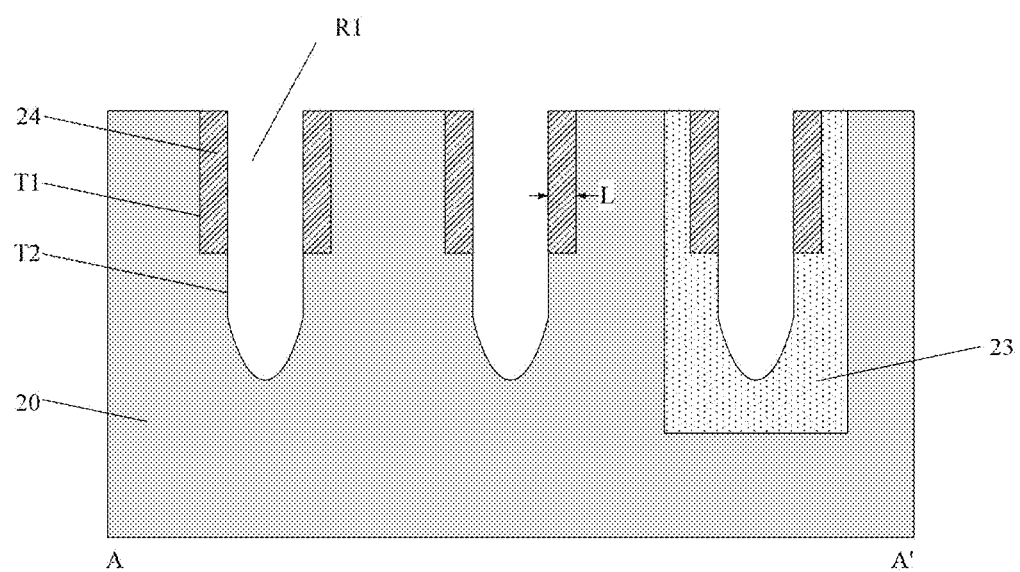

The first groove T1 is filled with an insulating material 24, as shown in FIG. 5B.

Part of the insulating material 24 is removed to form a first opening R1 exposing the part of the bottom surface of the first groove T1. The distance between a sidewall of the first opening R1 and a sidewall of the first groove T1 is the preset length L. The substrate 20 is etched downwards by the first opening R1 to form the second groove T2, as shown in FIG. 5C.

The insulating material 24 may be formed in the plurality of first grooves T1 by an atomic layer deposition (ALD) process, a chemical vapor deposition (CVD) process or other processes. Optionally, after the insulating material 24 is formed in the first grooves T1, a planarization process, e.g. a chemical mechanical polishing (CMP) and/or an etching process, may be adopted to make an upper surface of the insulating material 24 coplanar with an upper surface of the substrate 20. In an embodiment, the insulating material 24 includes a nitride, e.g. silicon nitride.

In an embodiment, the first opening R1 and the second groove T2 may be formed in one etching process step, which includes, but is not limited to, a dry etching process, such as a plasma etching process.

In an embodiment, the extension directions of the first opening R1 and the second groove T2 are the same as that of the first groove T1, and the first opening R1 has a uniform height and width in the extension direction.

The sidewall of the second groove T2 retracts inward by the preset length L relative to the sidewall of the first groove T1. In a specific embodiment, a ratio of the preset length L to the width of the first opening R1 is between 1:7 and 1:4, for example, between 1:8 and 1:5.

Figure 5D:
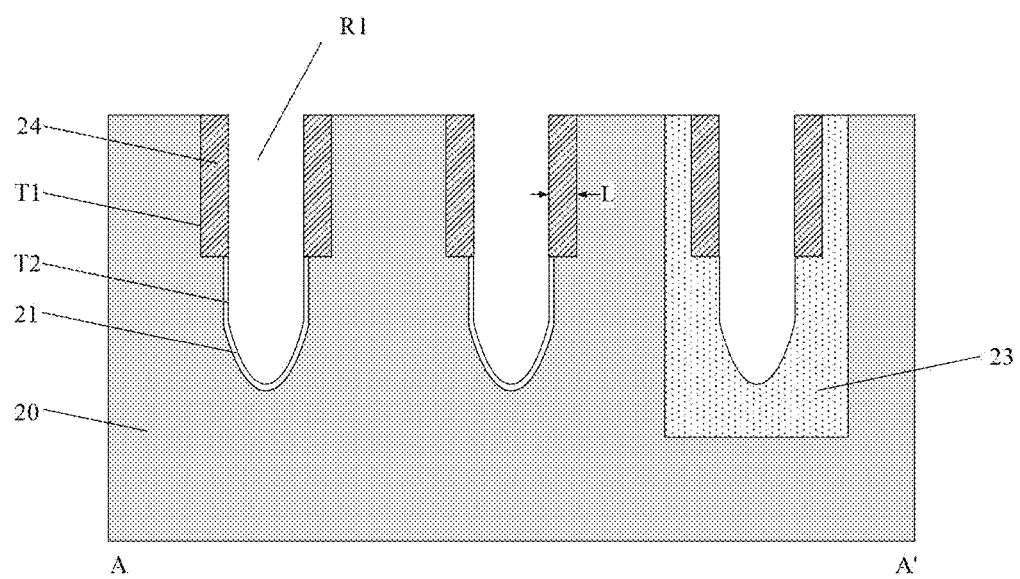

Next, S403 is performed to form a word line layer WL in the first groove T1 and the second groove T2. The word line layer WL includes the first sub-portion WL1 located in the second groove T2 and the second sub-portion WL2 located in the first groove T1. A gap (not identified) is provided between the sidewall of the second sub-portion WL2 and the sidewall of the first groove T1, as shown in FIGS. 5E-5F.

Figure 5E:
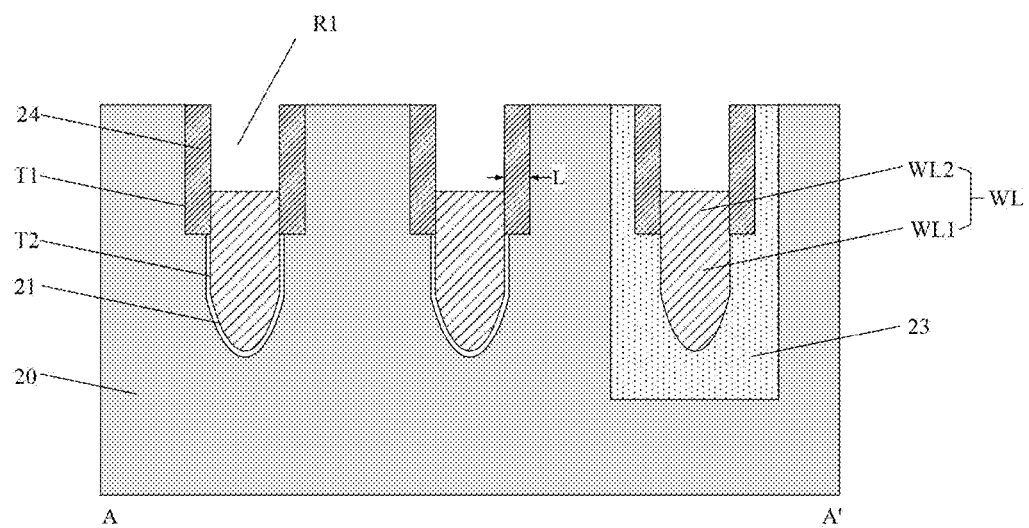
Figure 5F:
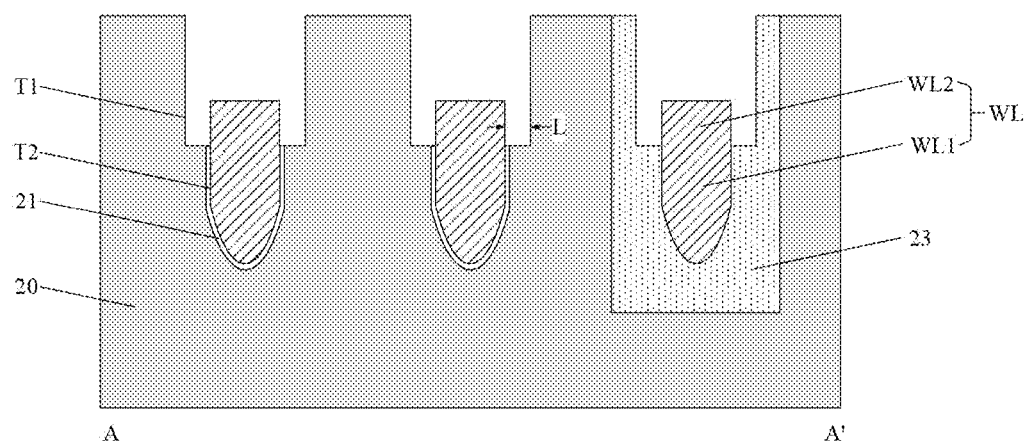

Specifically, referring to FIG. 5E, forming a word line layer WL in the first groove T1 and the second groove T2 includes the following operations.

A conductive material is deposited in the second groove T2 to form the first sub-portion WL1 of the word line layer WL.

The conductive material is further deposited in the first opening R1, and an etching-back process is performed to remove part of the conductive material in the first opening R1 to form the second sub-portion WL2 of the word line layer WL. It can be seen that the gap (not identified) filled with the insulating material 24 is located outside the first opening R1, so that the deposition of the conductive material is not affected. Thus, it is facilitated that the word line layer WL with a low voidage is formed.

The conductive material includes tungsten (W), copper (Cu), titanium (Ti), tantalum (Ta), titanium nitride (TiN), tantalum nitride (TaN), a metal silicide, a metal alloy or any combination thereof. The conductive material may be formed in the second groove T2 and the first opening R1 by a chemical vapor deposition (CVD) process, a plasma enhanced CVD (PECVD) process, a physical vapor deposition (PVD) process, an atomic layer deposition (ALD) process, an electroplating process, a chemical plating process, a sputtering process or other processes.

Specifically, the etching-back process includes, but is not limited to, a wet etching process, e.g. etching with a mixed liquid containing ammonium hydroxide and hydrogen peroxide.

The second sub-portion WL2 has a uniform height and width in the extension direction, and the width of a top of the first sub-portion WL1 is equal to the width of the second sub-portion WL2.

In an embodiment, the method further includes: after forming the second sub-portion WL2 of the word line layer WL, removing the remaining insulating material 24 in the first groove T1 to form the gap (not identified), as shown in FIG. 5F. In some embodiments, the process of removing the insulating material 24 includes, but is not limited to, a wet etching process, e.g. etching with a corrosive liquid containing phosphoric acid.

In an embodiment, the method further includes: before forming the word line layer WL in the first groove T1 and the second groove T2, forming a dielectric layer 21 in the second groove T2. The dielectric layer 21 covers the sidewalls and a bottom surface of the second groove T2 for separating the substrate 20 from the word line layer WL, as shown in FIG. 5D. In a specific embodiment, the thickness of the dielectric layer 21 is smaller than the preset length L.

Optionally, the dielectric layer 21 may be formed by converting part of the active area AA into the oxide with an in-situ thermal oxidation process. The material of the dielectric layer 21 includes, but is not limited to, silicon oxide.

Finally, S404 is performed to form a word line cover layer 22 in the first groove T1. An air gap structure 223 formed at least at the gap (not identified) is provided in the word line cover layer 22, as shown in FIGS. 5G-5K.

In an embodiment, the word line cover layer 22 includes a first sub-layer 221, a second sub-layer 222 located on the first sub-layer 221, and the air gap structure 223 confined by the first sub-layer 221 and the second sub-layer 222. Forming the word line cover layer 22 in the first groove T1 includes the following operations.

Figure 5G:
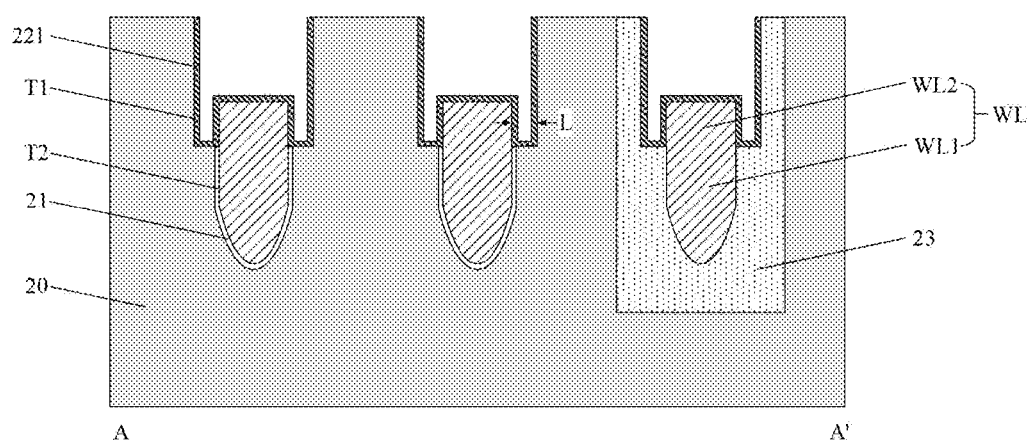

The first sub-layer 221 is formed in the first groove T1. The first sub-layer 221 covers the sidewalls and a bottom surface of the first groove T1 as well as the sidewalls and upper surface of the second sub-portion WL2, as shown in FIG. 5G.

Figure 5H:
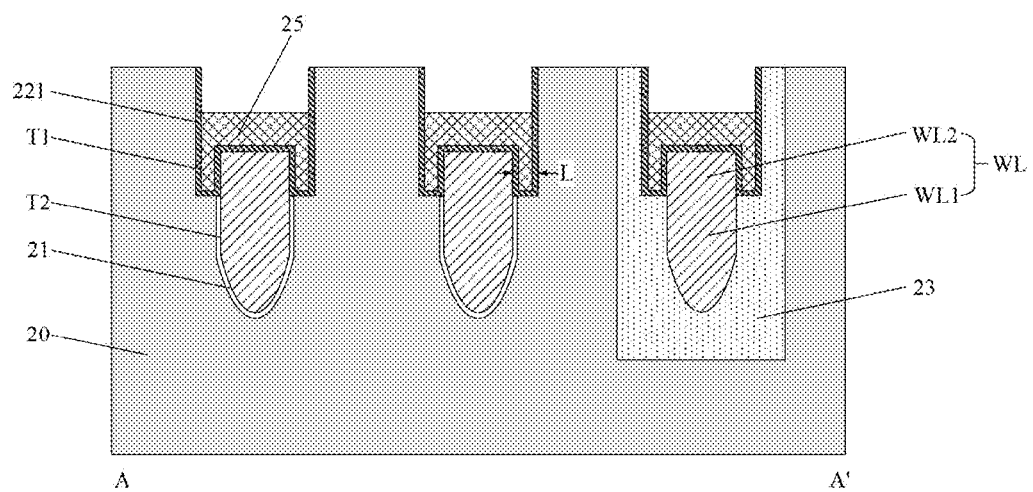

A sacrificial layer 25 is formed on the first sub-layer 221. The sacrificial layer 25 at least fills the gap (not identified), as shown in FIG. 5H.

Figure 5I:
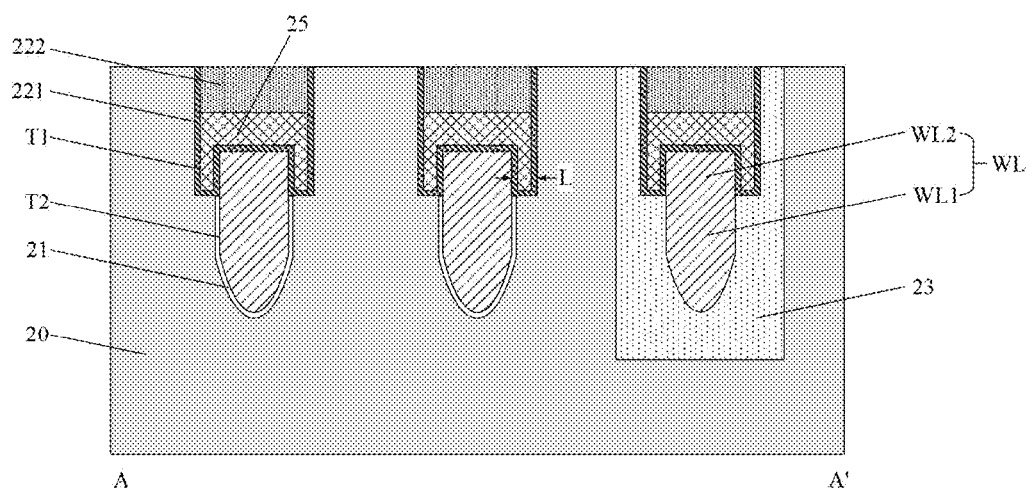

The second sub-layer 222 is formed on the sacrificial layer 25, as shown in FIG. 5I.

Figure 5J:
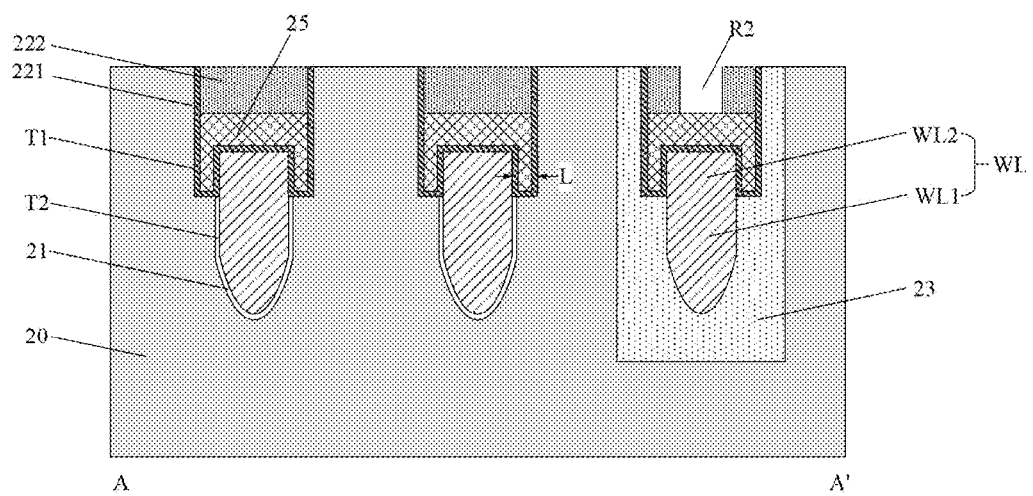
Figure 5K:
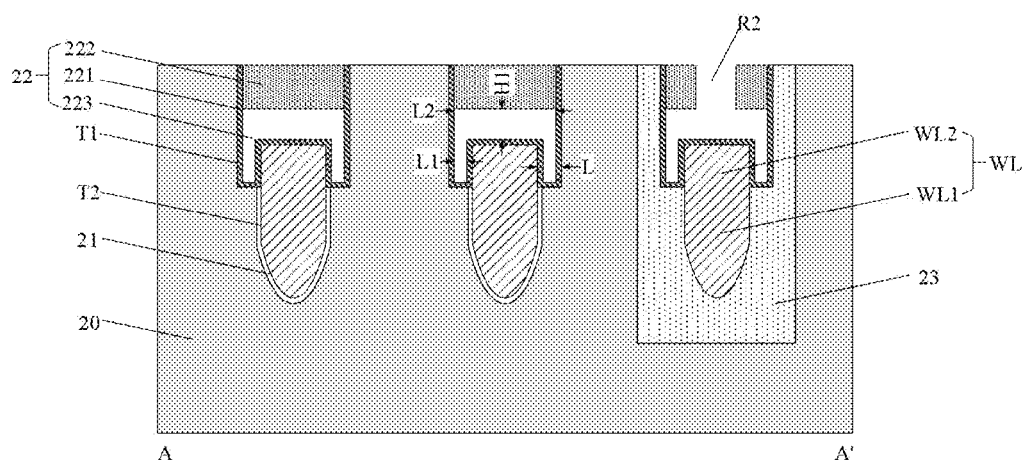

The sacrificial layer 25 is removed to form the air gap structure 223, as shown in FIGS. 5J-5K.

The material of the first sub-layer 221 is a dielectric material, specifically a nitride, e.g. silicon nitride. In some embodiments, the second sub-layer 222 and the first sub-layer 221 are formed from a same material. The formation process of the first sub-layer 221 and the second sub-layer 222 includes, but is not limited to, a chemical vapor deposition (CVD) process, a plasma enhanced chemical vapor deposition (PECVD) process, an atomic layer deposition (ALD) process or a combination thereof.

The sacrificial layer 25 may be formed in the first groove T1 by the atomic layer deposition (ALD) process, the chemical vapor deposition (CVD) process or other processes. Optionally, after the sacrificial layer 25 is formed in the first groove T1, part of the sacrificial layer 25 may be removed by a wet etching process, so that the sacrificial layer 25 at least fills the gap (not identified). The material of the sacrificial layer 25 is different from that of the first sub-layer 221 and the second sub-layer 222. In a specific embodiment, the material of the sacrificial layer 25 may be an oxide, e.g. silicon oxide. The wet etching process may be an etching process with a corrosive liquid containing hydrofluoric acid.

In an embodiment, removing the sacrificial layer 25 includes: forming at least one second opening R2 in the second sub-layer 222 to expose the sacrificial layer 25, as shown in FIG. 5J, in which the second opening R2 may be formed by a dry etching process, e.g. the plasma etching process; removing the sacrificial layer 25 by a wet etching process, as shown in FIG. 5K, in which the wet etching process may be an etching process with a corrosive liquid containing hydrofluoric acid.

In a specific embodiment, a bottom of the second opening R2 may penetrate into the sacrificial layer 25 to increase a contact area between the etching liquid and the sacrificial layer 25, so as to remove the sacrificial layer 25 more quickly.

The second opening R2 is formed in the second sub-layer 222 in the isolation area 23, as shown in FIG. 2.

In an embodiment, the sacrificial layer 25 not only fills the gap (not identified), but also covers the upper surface of the second sub-portion WL2, so that the finally formed air gap structure 223 extends from the gap (not identified) above the second sub-portion WL2, and the sidewalls and upper surface of the second sub-portion WL2 are all surrounded by the air gap structure 223. The air gap structure 223 extends above the second sub-portion WL2, which can further reduce the dielectric constant of the word line cover layer 22, thereby reducing the electric field intensity between the second sub-portion WL2 and the substrate 20. As a result, the control of the word line layer WL on the channel is effectively enhanced, improving the ability of the transistor to drive a current, thereby effectively reducing the GIDL effect and thus improving the reliability of the semiconductor device.

In an embodiment, the air gap structure 223 located at the gap (not identified) has a uniform first width L1 in the extension direction of the word line layer WL. A ratio of the first width L1 to the width of the word line layer WL is between 1:10 and 1:5.

In an embodiment, the air gap structure 223 located above the second sub-portion WL2 has a uniform second width L2 in the extension direction of the word line layer WL. A ratio of the second width L2 to the width of the word line layer WL is between 5:4 and 3:2.

In an embodiment, the air gap structure 223 located above the second sub-portion WL2 has a uniform first height H1 in the extension direction of the word line layer WL. A ratio of the first height H1 to the height of the word line layer WL is between 1:20 and 1:10.

In an embodiment, the manufacturing method further includes performing an ion implantation process on the substrate 20 to form a first source/drain doped region d1 and a second source/drain doped region d2 at the top of the active area AA, and finally forming a semiconductor device as shown in FIG. 3. In a specific embodiment, the first source/drain doped region d1 is located in the middle area of the active area AA, the second source/drain doped region d2 is located at the two ends of the active area AA, and the first source/drain doped region d1 and the second source/drain doped region d2 are separated by the word line layer WL and the word line cover layer 22 on the word line layer WL.

In a more specific embodiment, the first source/drain doped region d1 and the second source/drain doped region d2 have a same conductivity type, e.g. n type. Understandably, when the first source/drain doped region d1 and the second source/drain doped region d2 are n-type doping, the substrate 20 under the first source/drain doped region d1 and the second source/drain doped region d2 is p-type doping.

In an embodiment, lower surfaces of the first source/drain doped region d1 and the second source/drain doped region d2 are flush with or higher than the bottom surface of the first groove T1. That is, the lower surfaces of the first source/drain doped region d1 and the second source/drain doped region d2 are flush with or higher than a lower surface of the second sub-portion WL2.

In this way, the air gap structure 223 reduces the dielectric constant of the word line cover layer 22, thereby reducing the electric field intensity generated between the second sub-portion WL2 of the word line layer WL and the first source/drain doped region d1 as well as the second source/drain doped region d2. As a result, the control of the word line layer WL on the channel is effectively enhanced, improving the ability of the transistor to drive the current, thereby effectively reducing the GIDL effect and thus improving the reliability of the semiconductor device.

The above are only the preferred embodiments of the disclosure, and are not intended to limit the protection scope of the disclosure. Any modifications, equivalent replacements and improvements made within the spirit and principle of the disclosure shall be included in the protection scope of the disclosure.

INDUSTRIAL PRACTICABILITY

In the semiconductor device and the manufacturing method thereof provided by the embodiments of the disclosure, the semiconductor device includes a substrate, a first groove and a second groove located in the substrate, in which the second groove is formed by etching the substrate downwards from part of a bottom surface of the first groove, and a sidewall of the second groove retracts inward by a preset length relative to a sidewall of the first groove; a word layer including a first sub-portion located in the second groove and a second sub-portion located in the first groove, in which a gap is provided between a sidewall of the second sub-portion and that of the first groove; and a word line cover layer located in the first groove and covering the second sub-portion, in which an air gap structure at least located at the gap is provided in the word line cover layer. The second sub-portion of the word line layer is separated from the substrate by the thick word line cover layer with the air gap structure, which can effectively alleviate the GIDL leakage phenomenon and thus improve the reliability of the semiconductor device.

What is claimed is:

1. A semiconductor device, comprising:
a substrate, a first groove and a second groove located in the substrate, wherein the second groove is formed by etching the substrate downwards from part of a bottom surface of the first groove, and a sidewall of the second groove retracts inward by a preset length relative to a sidewall of the first groove;
a word layer comprising a first sub-portion located in the second groove and a second sub-portion located in the first groove, wherein a gap is provided between a sidewall of the second sub-portion and the sidewall of the first groove; and
a word line cover layer located in the first groove and covering the second sub-portion, wherein an air gap structure at least located at the gap is provided in the word line cover layer.

2. The semiconductor device according to claim 1, wherein a ratio of the preset length to a width of the word line layer is between 1:7 and 1:4.

3. The semiconductor device according to claim 1, wherein the word line cover layer comprises a first sub-layer, a second sub-layer located on the first sub-layer and the air gap structure confined by the first sub-layer and the second sub-layer, wherein the first sub-layer covers sidewalls and the bottom surface of the first groove as well as sidewalls and an upper surface of the second sub-portion.

4. The semiconductor device according to claim 1, wherein the air gap structure in the word line cover layer extends from the gap above the second sub-portion, so that sidewalls and an upper surface of the second sub-portion are all surrounded by the air gap structure.

5. The semiconductor device according to claim 4, wherein the air gap structure located at the gap has a uniform first width in an extension direction of the word line layer, and a ratio of the first width to a width of the word line layer is between 1:10 and 1:5.

6. The semiconductor device according to claim 4, wherein the air gap structure above the second sub-portion has a uniform second width in an extension direction of the word line layer, and a ratio of the second width to a width of the word line layer is between 5:4 and 3:2.

7. The semiconductor device according to claim 6, wherein the air gap structure above the second sub-portion has a uniform first height in the extension direction of the word line layer, and a ratio of the first height to a height of the word line layer is between 1:20 and 1:10.

8. The semiconductor device according to claim 3, wherein the first sub-layer and the second sub-layer are formed from a same material.

9. The semiconductor device according to claim 1, wherein the semiconductor device further comprises a dielectric layer located in the second groove and covering sidewalls and a bottom surface of the second groove.

10. The semiconductor device according to claim 9, wherein a thickness of the dielectric layer is smaller than the preset length.

11. A manufacturing method of a semiconductor device, comprising:
forming a first groove in a substrate;
etching the substrate downwards from part of a bottom surface of the first groove to form a second groove, wherein a sidewall of the second groove retracts inward by a preset length relative to a sidewall of the first groove;

forming a word line layer in the first groove and the second groove, wherein the word line layer comprises a first sub-portion located in the second groove and a second sub-portion located in the first groove, wherein a gap is provided between a sidewall of the second sub-portion and the sidewall of the first groove; and forming a word line cover layer in the first groove, wherein an air gap structure forned at least at the gap is provided in the word line cover layer.

12. The manufacturing method according to claim 11, wherein etching the substrate downwards from the part of the bottom surface of the first groove to form the second groove comprises:

filling an insulating material in the first groove;

removing part of the insulating material to form a first opening exposing the part of the bottom surface of the first groove, wherein a distance between a sidewall of the first opening and the sidewall of the first groove is the preset length; and etching the substrate downwards by the first opening to form the second groove.

13. The manufacturing method according to claim 12, wherein forming the word line layer in the first groove and the second groove comprises:

depositing a conductive material in the second groove to form the first sub-portion of the word line layer; and further depositing the conductive material in the first opening, and performing an etching-back process to remove part of the conductive material in the first opening to form the second sub-portion of the word line layer.

14. The manufacturing method according to claim 13, further comprising:

after forming the second sub-portion of the word line layer, removing the insulating material remained in the first groove to form the gap.

15. The manufacturing method according to claim 11, wherein the word line cover layer comprises a first sub-layer, a second sub-layer located on the first sub-layer and the air gap structure confined by the first sub-layer and the second sub-layer, and forming the word line cover layer in the first groove comprises:

forming the first sub-layer in the first groove, wherein the first sub-layer covers sidewalls and a bottom surface of the first groove as well as sidewalls and an upper surface of the second sub-portion;

forming a sacrificial layer on the first sub-layer, wherein the sacrificial layer at least fills the gap;

forming the second sub-layer on the sacrificial layer; and removing the sacrificial layer to form the air gap structure.

16. The manufacturing method of claim 15, wherein removing the sacrificial layer comprises:

forming at least one second opening in the second sub-layer to expose the sacrificial layer; and removing the sacrificial layer by a wet etching process.

17. The manufacturing method according to claim 16, wherein the substrate comprises an isolation area and an active area defined by the isolation area, wherein the second opening is formed in the second sub-layer in the isolation area.

18. The manufacturing method according to claim 11, further comprising:

before forming the word line layer in the first groove and the second groove, forming a dielectric layer in the second groove, wherein the dielectric layer covers sidewalls and a bottom surface of the second groove.

* * * * *